(12) United States Patent
Trezza

(10) Patent No.: US 7,960,210 B2
(45) Date of Patent: Jun. 14, 2011

(54) ULTRA-THIN CHIP PACKAGING

(75) Inventor: John Trezza, Nashua, NH (US)

(73) Assignee: Cufer Asset Ltd. L.L.C., Wilmington, DE (US)

( * ) Notice: Subject to any disclaimer, the term of this patent is extended or adjusted under 35 U.S.C. 154(b) by 156 days.

(21) Appl. No.: 11/738,817

(22) Filed: Apr. 23, 2007

(65) Prior Publication Data

US 2008/0258284 A1   Oct. 23, 2008

(51) Int. Cl.
*H01L 21/00* (2006.01)

(52) U.S. Cl. ........ 438/107; 438/106; 438/108; 438/109; 438/127

(58) Field of Classification Search ................... 438/106, 438/108, 109, 119, 127, 107
See application file for complete search history.

(56) References Cited

U.S. PATENT DOCUMENTS

| | | |
|---|---|---|
| 3,312,878 A | 4/1967 | Poch et al. |
| 5,100,480 A | 3/1992 | Hayafuji |
| 5,220,530 A | 6/1993 | Itoh |
| 5,229,315 A | 7/1993 | Jun et al. |
| 5,308,784 A | 5/1994 | Kim et al. |
| 5,399,898 A | 3/1995 | Rostoker |
| 5,563,084 A | 10/1996 | Ramm et al. |
| 5,587,119 A | 12/1996 | White |
| 5,608,264 A | 3/1997 | Gaul |
| 5,708,569 A | 1/1998 | Howard et al. |
| 5,780,776 A | 7/1998 | Noda |
| 5,814,889 A | 9/1998 | Gaul |
| 5,872,338 A | 2/1999 | Lan et al. |
| 5,929,524 A | 7/1999 | Drynan et al. |
| 5,962,922 A | 10/1999 | Wang |
| 5,973,396 A | 10/1999 | Farnworth |
| 6,037,665 A | 3/2000 | Miyazaki |
| 6,075,710 A | 6/2000 | Lau |
| 6,184,066 B1 | 2/2001 | Chino et al. |
| 6,215,114 B1 | 4/2001 | Yagi et al. |
| 6,314,013 B1 | 11/2001 | Ahn et al. |
| 6,316,737 B1 | 11/2001 | Evans et al. |
| 6,498,089 B2 | 12/2002 | Komada |
| 6,559,540 B2 | 5/2003 | Kawashima |
| 6,577,013 B1 | 6/2003 | Glenn et al. |
| 6,590,278 B1 | 7/2003 | Behun et al. |
| 6,599,778 B2 | 7/2003 | Pogge et al. |

(Continued)

FOREIGN PATENT DOCUMENTS

EP     0 516 866 A1    12/1992

(Continued)

OTHER PUBLICATIONS

International Search Report for PCT/US06/23364, dated Nov. 13, 2006.

(Continued)

*Primary Examiner* — Zandra Smith
*Assistant Examiner* — Jamie Niesz

(57) ABSTRACT

A packaging method involves attaching a first chip to a stable base, forming contact pads at locations on the stable base, applying a medium onto the stable base such that it electrically insulates sides of the first chip, forming electrical paths on the medium, attaching a second chip to the first chip to form an assembly, and removing the stable base. A package has at least two chips electrically connected to each other, at least one contact pad, an electrically conductive path extending from the contact pad to a contact point on at least one of the chips, a planarizing medium, and a coating material on top of the planarizing medium.

26 Claims, 14 Drawing Sheets

U.S. PATENT DOCUMENTS

| | | |
|---|---|---|
| 6,706,554 B2 | 3/2004 | Ogura |
| 6,740,576 B1 | 5/2004 | Lin et al. |
| 6,770,822 B2 | 8/2004 | Pasternak et al. |
| 6,774,499 B1 * | 8/2004 | Yang .............................. 257/786 |
| 6,939,789 B2 | 9/2005 | Huang et al. |
| 6,958,544 B2 * | 10/2005 | Sunohara ...................... 257/758 |
| 7,157,310 B2 | 1/2007 | Benson et al. |
| 7,190,080 B1 | 3/2007 | Leu et al. |
| 2001/0001292 A1 | 5/2001 | Bertin et al. |
| 2001/0033509 A1 | 10/2001 | Ahn et al. |
| 2001/0048166 A1 | 12/2001 | Miyazaki |
| 2002/0017399 A1 | 2/2002 | Chang et al. |
| 2002/0027441 A1 | 3/2002 | Akram et al. |
| 2002/0053726 A1 | 5/2002 | Mikubo et al. |
| 2002/0094675 A1 | 7/2002 | Kerr et al. |
| 2002/0102835 A1 | 8/2002 | Stucchi et al. |
| 2002/0127761 A1 | 9/2002 | Mottura et al. |
| 2002/0134581 A1 | 9/2002 | Figueroa et al. |
| 2003/0047799 A1 | 3/2003 | Cheever et al. |
| 2003/0052324 A1 | 3/2003 | Kimura |
| 2003/0080408 A1 | 5/2003 | Farnworth et al. |
| 2003/0085471 A1 | 5/2003 | Iijima et al. |
| 2003/0159262 A1 | 8/2003 | Pasternak et al. |
| 2003/0206680 A1 | 11/2003 | Bakir et al. |
| 2004/0051168 A1 | 3/2004 | Arai et al. |
| 2004/0124523 A1 | 7/2004 | Poo et al. |
| 2004/0145044 A1 * | 7/2004 | Sugaya et al. ................ 257/698 |
| 2004/0207061 A1 | 10/2004 | Farrar et al. |
| 2004/0256686 A1 | 12/2004 | Sassolini et al. |
| 2004/0262635 A1 | 12/2004 | Lee |
| 2005/0046034 A1 | 3/2005 | Farrar |
| 2005/0104027 A1 | 5/2005 | Lazarev |
| 2005/0104219 A1 | 5/2005 | Matsui |
| 2005/0121768 A1 | 6/2005 | Edelstein et al. |
| 2005/0146049 A1 | 7/2005 | Kripesh et al. |
| 2005/0157477 A1 * | 7/2005 | Kuramochi et al. .......... 361/761 |
| 2006/0046350 A1 * | 3/2006 | Jiang et al. ..................... 438/114 |
| 2006/0278972 A1 | 12/2006 | Bauer et al. |
| 2007/0054439 A1 * | 3/2007 | Yang .............................. 438/127 |

FOREIGN PATENT DOCUMENTS

| | | |
|---|---|---|
| EP | 0 757 386 A2 | 2/1997 |
| EP | 1 415 950 | 5/2004 |
| EP | 1418617 | 5/2004 |
| EP | 1758438 | 2/2007 |

OTHER PUBLICATIONS

International Search Report for PCT/US06/23366, dated Dec. 8, 2006.
International Search Report, PCT/US06/23297, dated Jan. 3, 2007.
International Search Report, PCT/US06/23249, dated Jun. 11, 2007.
Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.
International Search Report, PCT/US06/23361, dated Sep. 19, 2007.
International Search Report and Written Opinion for PCT/IB2008/001626 mailed on Oct. 29, 2008.
International Preliminary Report on Patentability for PCT/IB2008/001626 mailed Nov. 5, 2009.
Non-final Office Action issued in U.S. Appl. No. 12/499,554 and mailed on May 7, 2010 and received on May 10, 2010.
Non-final Office Action issued in U.S. Appl. No. 12/499,554 mailed Feb. 2, 2011.
Office Action issued in Korean Patent Application No. 10-2009-7023473 and dated Mar. 14, 2011.

* cited by examiner

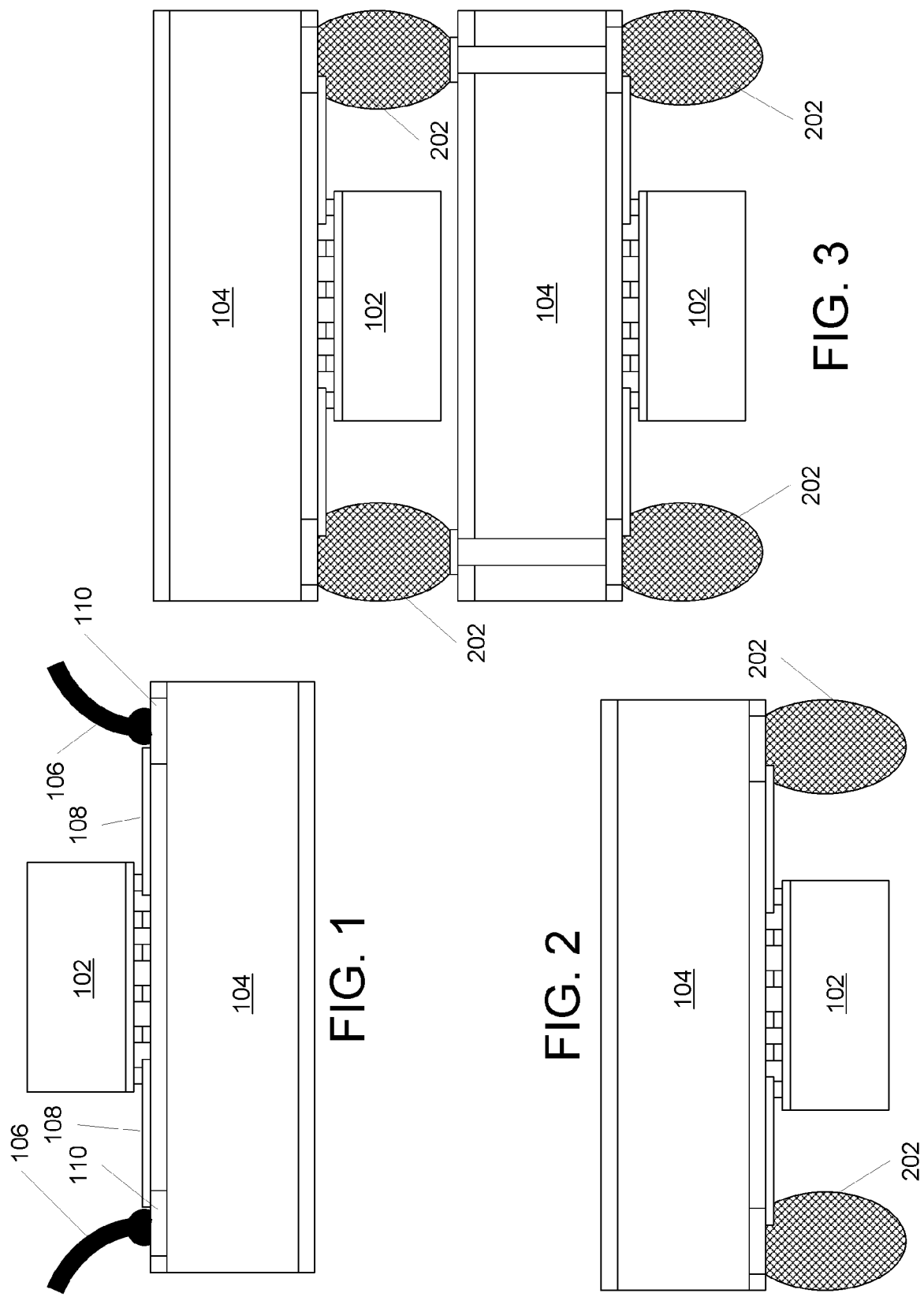

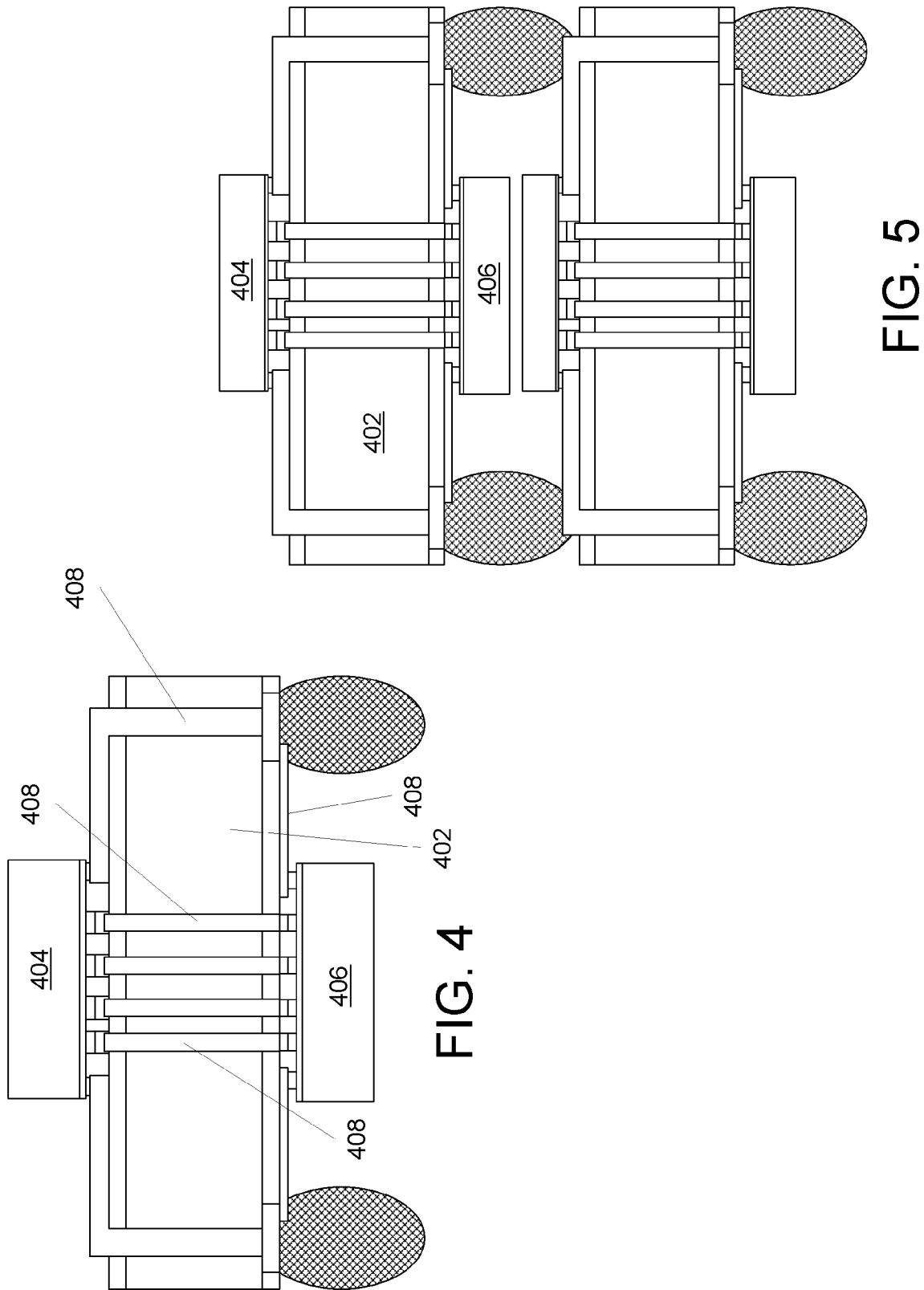

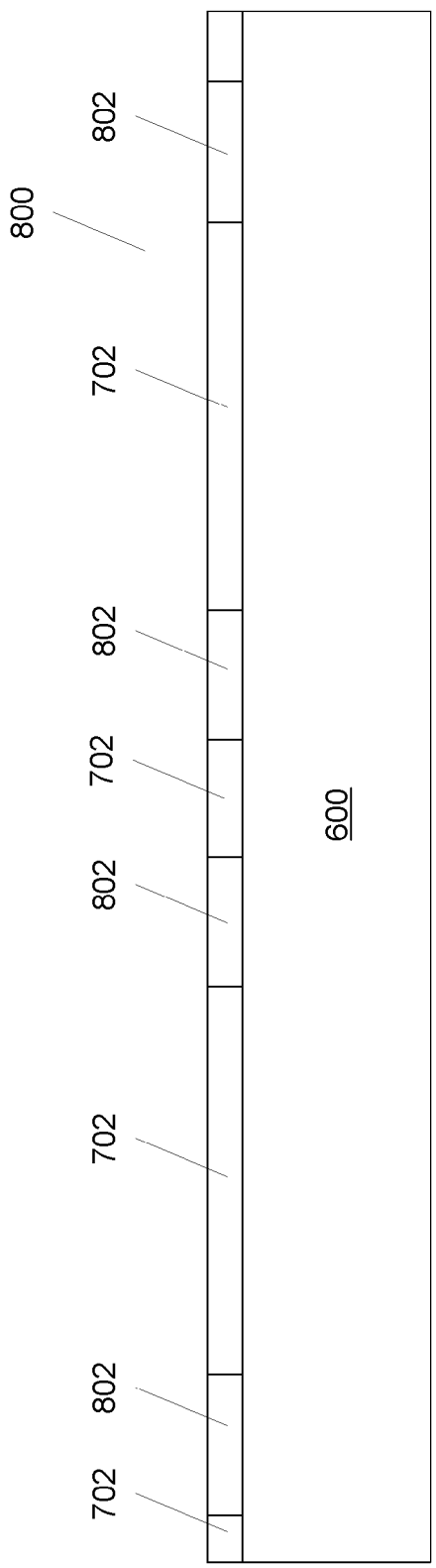
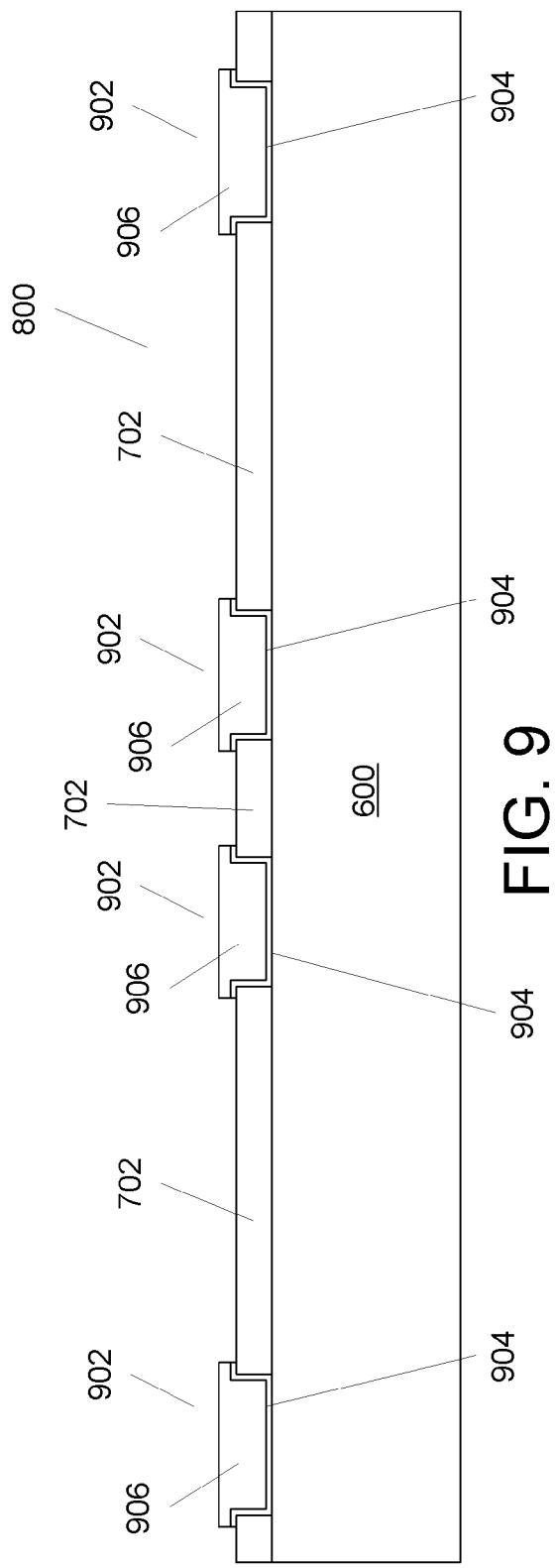

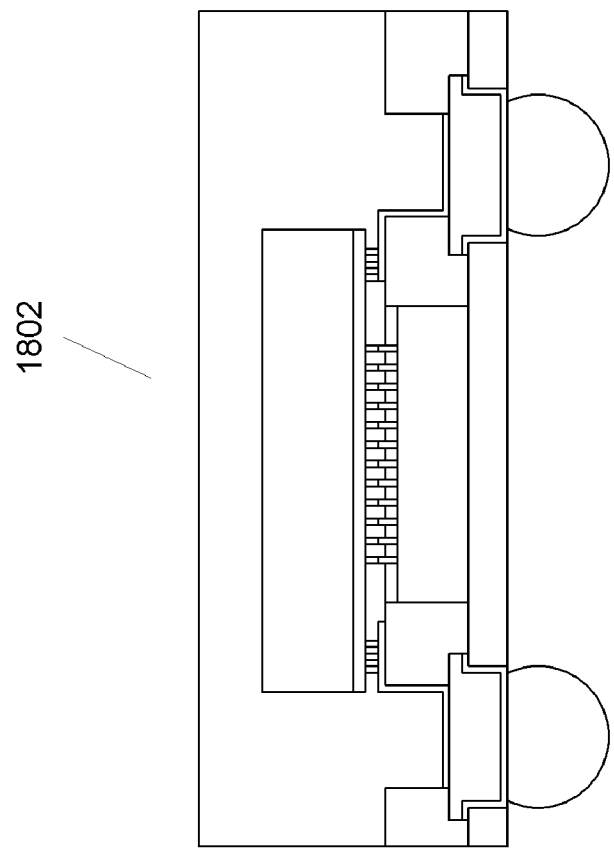
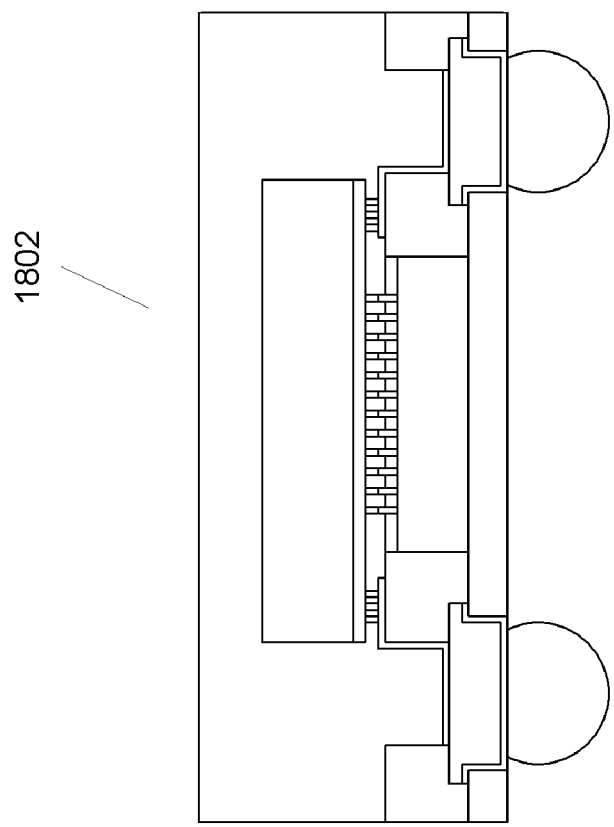
FIG. 18

ULTRA-THIN CHIP PACKAGING

FIELD OF THE INVENTION

The present invention relates to electronic packaging and, more particularly, to chip packaging.

BACKGROUND

It has long been desirable to be able to pack as many chips into as small a space as possible. More recently, this has led to the development of various integration techniques.

One such integration method, shown in FIG. 1, involves directly attaching one die 102 onto a second die 104. This allows the top die 102 and bottom die 104 to communicate directly with each other. In addition, the two chips 102, 104 are externally connected using wirebonds 106 connected to the chip(s) via a routing trace 108. While this approach results in a smaller package, it also results in a problem if the two chips are the same size or of nearly the same size, because, in some cases, there might not be enough room for wirebond pads 110 to exist on one of the dies. Moreover, using this approach with multiple chips (e.g. by stacking several of these two chip units on top of one another in a multi-chip on multi-chip arrangement is both difficult and expensive if wirebonds 106 must be used.

Another integration option, shown in FIG. 2, is to use solder ball 202, flip-chip attachment methods to allow the two die stack to be externally connected. This approach is cheaper than the wirebond approach and, thus, can allow some of the multi-chip on multi-chip arrangements (FIG. 3) to be more easily or cheaply achieved. However, this integration option suffers from the same problem as noted above if the two chips are the same or nearly the same size, because there might not be enough room for solder ball pads to exist on one of the dies.

Still further, the process of stacking the multi-chips (FIG. 3) would require each of the dies to be very, very thin so that the height of the chip 102 that would attach to the chip 104 containing the solder bump pads will be less than the height of a solder ball bump 202 itself Compounding the problem is the fact that the multi-chip on multi-chip stack's overall height will likely also have to be small so that it can fit within standard packages. This requires handling many wafers or dies that are very thin and then performing dual side processing on these thin wafers. As a result, there is a significant risk of yield loss and damage to dies, especially if solder balls 202 must be mounted on those very thin pieces.

Yet another integration option, shown in FIG. 4, is to use a passive device known as an "interposer" 402 that can act as a routing element to connect the two dies together and externally. This approach has the advantage that it eliminates the issue of whether the two dies 404, 406 are identical or close in size because it can always be made big enough to accommodate a wirebond or solder bump connection. However, interposers typically also have has significant drawbacks. For example, they usually require fabrication of an entirely new part (the interposer with its attendant routing 408) which could be complicated and expensive. Moreover, the typical interposer option does not eliminate the issue of handling very thin wafers or doing dual-side processing of those very thin wafers, so the above-mentioned decreased yield and increased damage risks remain. Still further, interposers are typically very thick, so, even if the interposer has through-connections 408, the length of the connections between the two dies are now larger, so the electrical performance of the chip to chip connection can be degraded.

The interposer option also does not dispense with the problems noted above with creating a multi-chip to multi-chip stack (FIG. 5).

In addition, with such an approach it may be necessary to use vias in chips containing active devices which, in some applications, might not be desirable because they take up potential circuit area, increase the risk of yield loss, or both.

Yet further, to add a third 'chip' to the stack, each of the individual chips must be even thinner than the option that only had two chips, thereby further adding to the risks of decreased yield and damage.

Thus, there is a need for a packaging option that does not suffer from the problems and/or risks presented by the foregoing options presently available.

SUMMARY OF THE INVENTION

We have developed a process for integrating chips together that reduces or eliminates the problems present with the above processes.

Depending upon the particular variant, our approaches can provide one or more of the following benefits: they can be used with two chips of any arbitrary size, they can allow the final stack height to be very thin so that multi-chip on multi-chip configurations can be created, they can eliminate the need to make vias in an active chip, they can eliminate the need to make through-die vias entirely (i.e. whether or not the die contains devices), they can eliminate the need for a specially created interposer chip, they involve a thick and stable platform, they eliminate the need to perform dual-side processing of the individual die, and they still allow for the use of small, dense connections without the electrical performance 'hit' imposed by an interposer through-via structure.

One example variant involves a packaging method. The method involves attaching a first chip to a stable base, forming contact pads at locations on the stable base, applying a medium onto the stable base such that it electrically insulates sides of the first chip, forming electrical paths on the medium, attaching a second chip to the first chip to form an assembly, and removing the stable base.

Another example variant involves a package having at least two chips electrically connected to each other, at least one contact pad, an electrically conductive path extending from the contact pad to a contact point on at least one of the chips, a planarizing medium, and a coating material on top of the planarizing medium.

Through use of one or more of the variants described herein, one or more of various advantages described herein can be achieved. The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

FIG. 1 illustrates, in overly simplified form, a chip stack having a wirebond external connection;

FIG. 2 illustrates, in overly simplified form, a chip stack having a solder ball external connection;

FIG. 3 illustrates, in overly simplified form a chip on chip stack;

FIG. 4 illustrates, in overly simplified form an interposer-based approach to chip stacking;

FIG. 5 illustrates, in overly simplified form an interposer-based multi-chip to multi-chip stack;

FIG. 8 illustrates, in overly simplified form, an enlarged portion of the example stable base after the openings have been formed in the support coating;

FIG. 9 illustrates, in overly simplified form, an enlarged portion of the example stable base after pads have been formed within what was the openings in the support coating;

FIG. 18 illustrates, in overly simplified form, two individual packaged units following dicing from the complex assembly of FIG. 15;

DETAILED DESCRIPTION

Figure 6:
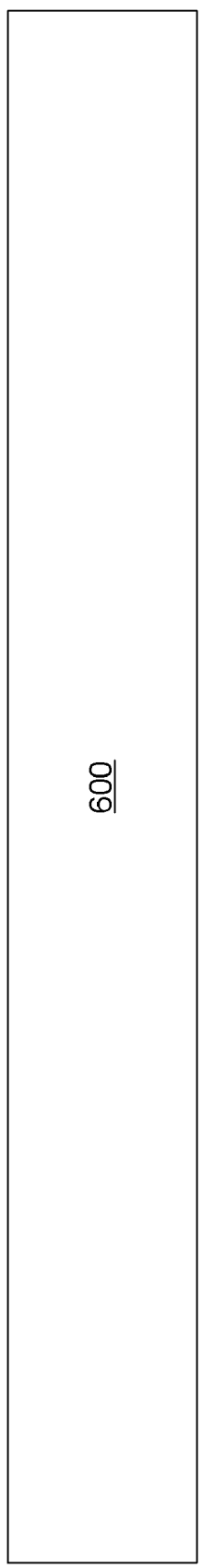
FIG. 6 illustrates, in overly simplified form, an example stable base suitable for use as the starting point.

The approach will now be described with reference to two simplified example major implementation variants. The first simplified example implementation family, shown in FIGS. 6 through 18, involves creation of a chip package that contains a stack of two chips of differing size in which the initial chip in the stack is smaller in extent than the chip that will be stacked on top of it. The second simplified example implementation family involves creation of a chip package that contains a stack of two chips of differing size in which the initial chip in the stack is larger in extent than the chip that will be stacked on top of it. These two major examples are used because they illustrate the two extremes, with all other examples, including equally sized chips, falling between the two.

Notably, in the interest of brevity, only the steps pertinent to understanding the approach are described. Thus, there may be additional straightforward intermediate steps that me need to be performed to go from one described step to another. However, those intermediate steps will be self evident to the pertinent audience. For example, as described a step may involve depositing a metal in a particular area. From that description, it is to be understood that, absent express mention of a process and that it is the required or only way to accomplish the transition, any suitable known intermediate process can be used. For example, one variant may involve, applying a photoresist, patterning, metal deposition, stripping of the photoresist and, if appropriate, removal of overburden. Another variant might involve electroless or electroplating and thus patterning, seed deposition, etc. Thus, unless expressly stated otherwise, it should be presumed that any known way to get from one point in the process to another point in the process can be used and will be acceptable.

The process begins with a piece of material that will act as a stable base for most of the process, but will later be removed. Depending upon the particular implementation, this base can be any of a number of different things, for example, a silicon wafer that can later be removed through an etching process, or a material such as glass, sapphire, quartz, a polymer, etc. the relevant aspects being i) that the material that will be used as the base has sufficient rigidity and stability to withstand the processing steps described below, and ii) that the material can be removed when necessary in the process using a technique that will not damage the package created up to that point, irrespective of whether the process involves removal by chemical, physical or heat action (or some combination thereof) or some other process.

The purpose of the material is to primarily provide mechanical support during the processing steps and thereby avoids the thin wafer handling problems noted above because, to the extent "thin" components are involved, they are handled at the chip level, while still allowing the major steps to be performed at the wafer level.

Advantageously, through this approach, the contact formation and use techniques as described in U.S. patent application Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, all incorporated herein by reference, can be employed, even though through-chip vias need not be part of the techniques described herein, although they are not incompatible, and thus can be used, with some implementations.

The process will now be described with reference to the figures, bearing in mind that dimensions are not to scale and are grossly distorted for ease of presentation even though specific dimensions may be provided for purposes of explanation.

FIG. 6 illustrates, in overly simplified form, an example stable base 600 suitable for use as the starting point. The stable base 600 of this example is a wafer of silicon that is about 300 mm in diameter and 800 μm thick.

Initially, a thin layer of support coating 702, for example about 0.5 μm, is applied to a surface 704 of the stable base 600. Depending upon the method to later be used to remove the stable base 600, as described below, the support coating 702 can be selected to be a material that can act as an etch stop for later processing, a release layer to ultimately allow the clean removal of the stable base 600 material without damaging the chips and connections that will be added in later steps, or both.

Depending upon the particular implementation, the support coating 702 can be an oxide or other dielectric, a polymer, a metal, a deposited semiconductor material, or some combination thereof.

In one example variant, the support coating 702 is simply used as an etch stop that will be left in place when processing is finished.

In another example variant, the support coating 702 is used as an etch stop that will be removed in a later processing step.

In yet another example variant, the support coating 702 is used as a release layer that, by etching, causes separation of the stable base 600 from the subsequently deposited parts (which will be discussed in greater detail below).

In still another example, the support coating 702 is a combination. In the combination case, for example, a metal could be added as an etch stop and then, subsequently, a dielectric could be deposited to prevent the connection pads that, will be created in a later step described below, from being shorted after the final work was done. In this specific example case, the dielectric would therefore remain while the metal that would be used as an etch stop will ultimately be removed.

Figure 7:
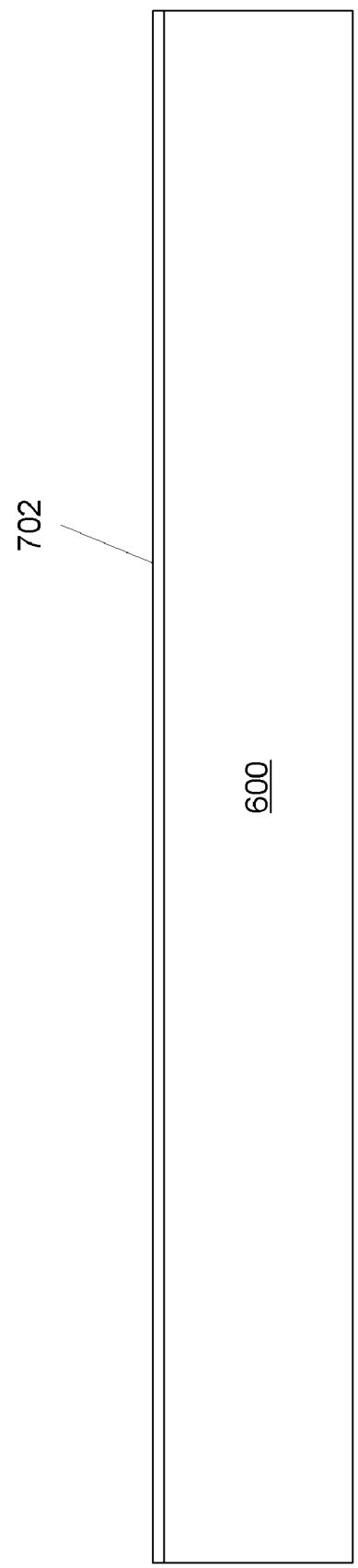
FIG. 7 illustrates, in overly simplified form, the example stable base after the support coating has been applied.

FIG. 7 illustrates, in overly simplified form, the example stable base 600 after the support coating 702 has been applied. For purposes of this example explanation, the support coating 702 is a dielectric.

Next, openings 802 are formed in the support coating 702 in the areas where the ultimate connection pads will be. The openings 802 extend down to the support material so that the final contacts that will be created in those openings 802 will be accessible after the stable base 600 is removed.

Depending upon the particular implementation, the openings can be created using any approach suitable for the particular support coating 702 used.

FIG. 8 illustrates, in overly simplified form, an enlarged portion 800 of the example stable base 600 after the openings 802 have been formed in the support coating 702. For purposes of this example explanation, the openings have been formed by patterning and etching.

Next, the pads 902 for the ultimate contacts are formed. Depending upon the particular implementation variant, the pads 902 can be sized and of materials that are suitable for conventional solder connections or wirebond connection pad or can be made up of materials suitable for other types of connection contacts, for example, those suitable for use with a post and penetration connection or the other types of connections described in the above-incorporated applications, as well as gold stud bumps, copper pillars, or combinations of suitable metals like solder tipped copper pillars, gold covered copper, etc. or alloys. In addition, the layers could incorporate, as described below in connection with FIG. 17, conductive bonding material so that they do not have to be separately placed later in the process.

FIG. 9 illustrates, in overly simplified form, the enlarged portion of the example stable base 600 after pads 902 have been formed within what had been the openings 802 in the support coating 702. As shown, the pad 902 is made up of a layer 904 of deposited gold underlying a pad body 906 of copper. In some variants, the pad 902 could be or contain a conventional under-bump-metal (UBM) set of materials, for example, nickel/gold. In other variants, it could be a conventional aluminum or copper pad with nickel or gold as a barrier or oxidation barrier. Note additionally, the layer 904 could additionally have something underneath it, for example, a solid material, or one of a "malleable" or "rigid" material as described in the above-incorporated applications, to allow for different types of stacking options. In some variants, these materials could be attached to or partially embedded in the stable base 600 at appropriate locations prior to starting the process. Finally, although the specific materials described are all electrically conducting, in some variants, some of the locations for the pad 902 can be filled by materials that are nonconducting (for example, if they are to be used for alignment or spacing purposes).

Next, the first chip 1002 is placed and attached to the stable base 600, in this case so that it is "face-up" (i.e. the circuitry on the chip faces away from the stable base 600). In the case of a chip that does not have through-vias, the chip is attached in any way suitable for forming a physical connection between the first chip 1002 and the stable base 600. Depending upon the particular implementation, the attachment can involve using, for example, epoxy, solder, covalent bonding, a tack and/or fuse connection, thermo compression, wafer fusion, copper fusion, adhesive or thermal release bonding tapes or films, etc.

Alternatively, and advantageously, in some implementation variants, the pad 902 can even be configured to later serve as a wirebond or flip chip pad, as the flip chip bump itself or as a combination of a pad and bump.

Optionally, if the first chip 1002 has conventional through-chip vias, or through-chip connections or vias such as described in the above-incorporated applications, the first chip 1002 can be attached "face-down" so it makes contact from the bottom.

Depending upon the particular implementation, the first chip 1002 may have undergone additional processing pre- or post-dicing from its original wafer. However, the last processing step for the first chip 1002 prior to use in this process should ideally be either that the wafer is thinned and then the individual chips diced from it, or the chips are diced from the wafer and then thinned so that only the individual chips are handled in thin form.

Figure 10:
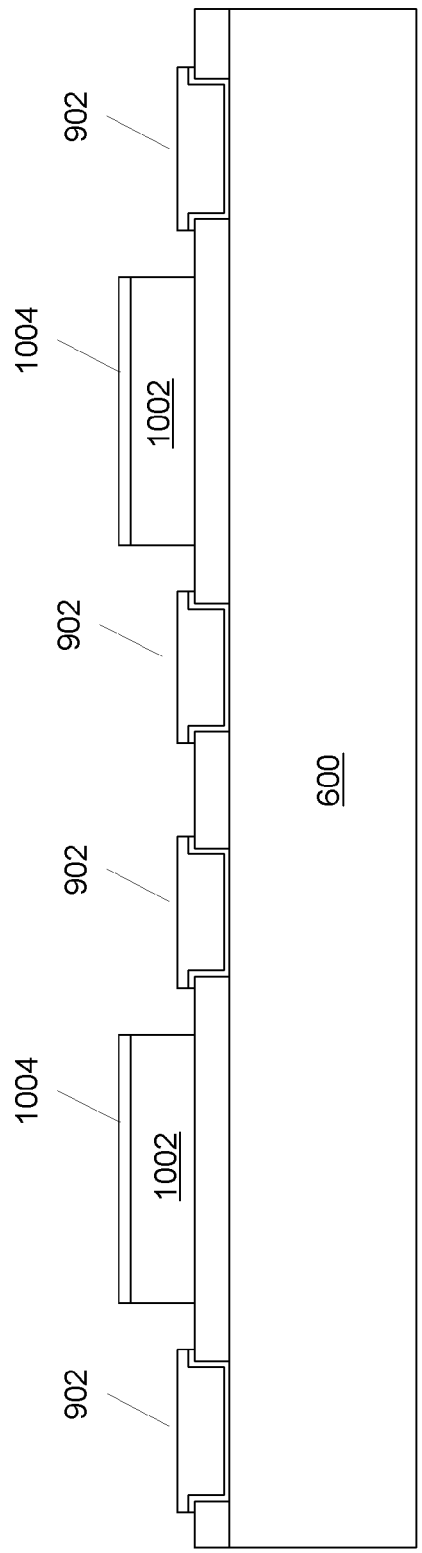
FIG. 10 illustrates, in overly simplified form, the enlarged portion of the example stable base after all of the first chips for the enlarged portion have been attached to the stable base.

FIG. 10 illustrates, in overly simplified form, the enlarged portion 800 of the example stable base 600 after all of the first chips 1002 for the enlarged portion have been attached to the stable base 600.

Once the first chip 1002 has been attached to the stable base 600, the surface of the stable base 600 is planarized using a planarizing medium 1102.

Depending upon the particular implementation variant, the planarizing medium 1102 can be a spin-on glass, polymer, epoxy, dielectric, oxide, nitride or other appropriate material, the important aspects being that the planarizing medium 1102 be non-electrically-conducting and will form or can be treated to form a substantially planar surface.

In some variants, the planarizing medium 1102 is applied so that it is coincident or nearly coincident with the top of the first chip 1002. In such a case, if the material will naturally form a planar surface, no further processing may be needed within this step. Alternatively, in other variants, the planarizing medium 1102 is applied so that it covers the first chip 1002 and may or may not naturally form a flat surface. In such a case, the planarizing medium 1102 can be planarized by further processing, for example, polishing, lapping, etching, liftoff, developing out material, etc. In another, variant similar to the second case, only the surface 1004 of the first chip 1002 (or some portion thereof) can be re-exposed by, for example, one or more of the foregoing processes. Alternatively, if the first chip is the same size or larger than the contact area of the chip that will be stacked on top of it, simple use of a conformal insulating coating to at least cover the sides of the first chip 1002 can be used if the height of the first chip 1002 is short enough. In general, the pertinent aspect for this step is that a surface is formed such that metal routing layers can later be added without creating open circuits or shorting to the sides of the first chip 1002.

Figure 11:
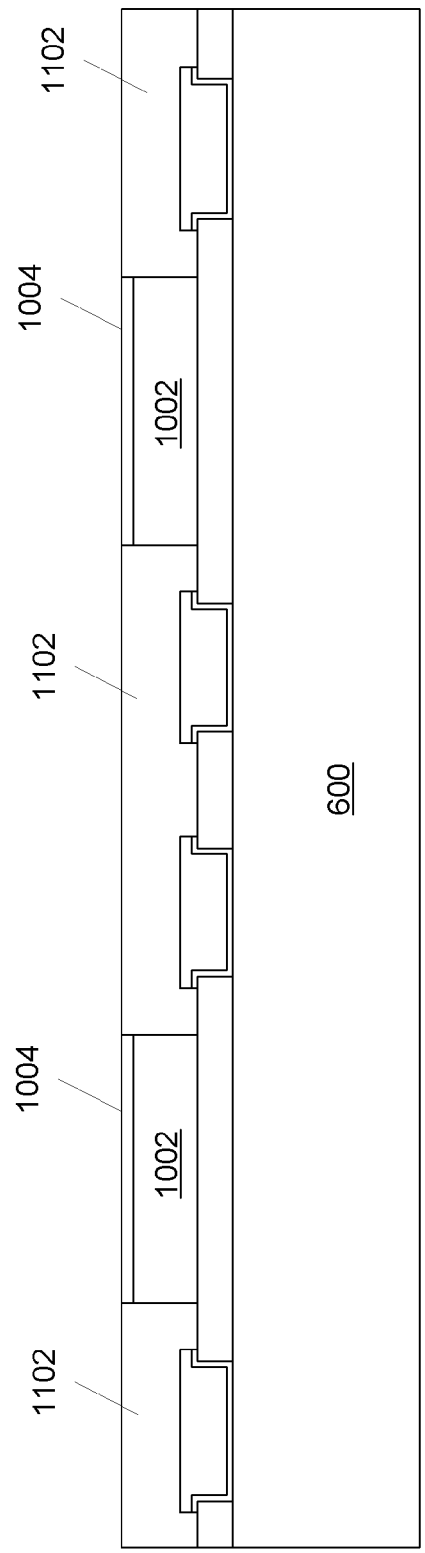
FIG. 11 illustrates, in overly simplified form, the enlarged portion of the example stable base after planarization down to the surface of the first chip.

FIG. 11 illustrates, in overly simplified form, the enlarged portion 800 of the example stable base 600 after planarization down to the surface 1004 of the first chip 1002.

Next, the planarizing medium 1102 is removed in specific areas 1202 to expose the pad body 906 and any other areas which may need to be exposed for purposes of forming connections.

Advantageously, if the planarizing medium 1102 is a photo-sensitive material, such as a photo-sensitive polyimide, then a simple pattern and expose can be used to make the planarizing medium 1102 ready for this step. Note that as part of this step, etching can be performed wherever it is needed or desired, for example, on top of the first chip 1002, on top of the pad body 906 (such as shown in FIG. 12), on top of some other area, etc., as long as the sides of the first chip 1002 are protected so that undesirable shorting cannot occur to those areas in subsequent steps.

Figure 12:
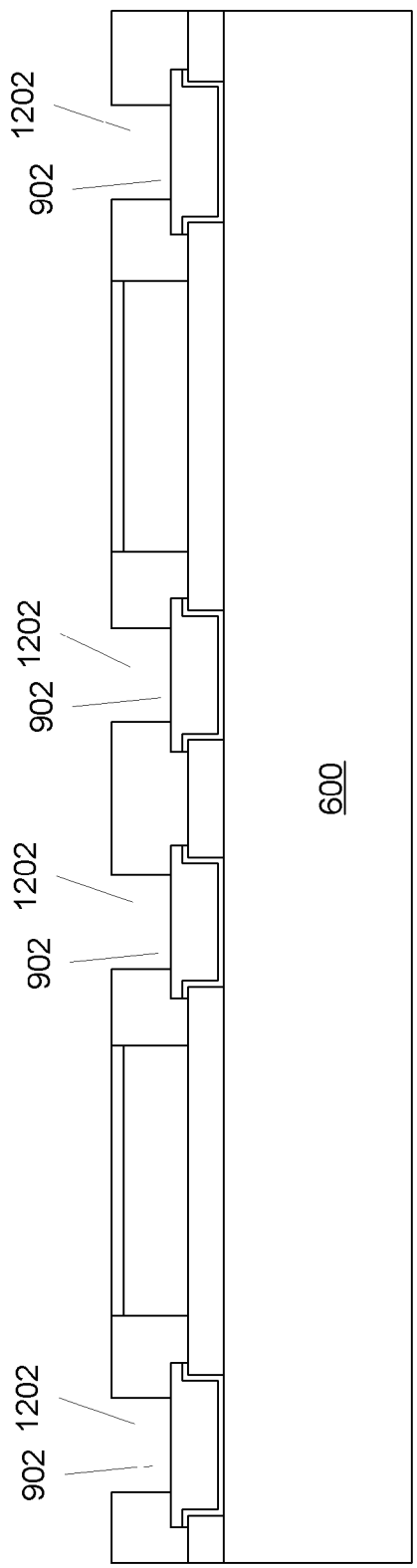
FIG. 12 illustrates, in overly simplified form, the enlarged portion of the example stable base after removal of the planarizing medium in some areas to expose at least the pad body.

FIG. 12 illustrates, in overly simplified form, the enlarged portion 800 of the example stable base 600 after removal of the planarizing medium 1102 in some areas to expose at least the pad bodies 902. Note that, in the example of FIG. 12, additional etching has been performed on the first chip 1002 to allow for creation of contact posts.

At this point, metal connections 1302, 1304 are formed so that, for example, the pad bodies 902 are connected to the first chip 1002, the pad bodies 902, other connection points are rerouted to positions which can ultimately align with corresponding connections of another chip or some other element, or (optionally, if needed) elevated contacts 1306 are formed. Of course, in many variants, some combination of both of these will occur and, in some cases, a pad body 902, can be intentionally connected to another pad body (not shown).

Because the height of the first chip 1002 can be small, since it is only handled as a die, the opening formed by removal of the planarizing medium 1102 can have a low aspect ratio. This allows the use of a low cost deposition technique or even a simple plating process for making connections. In other words, specialized or advanced via filling techniques are not required and, in fact can be used, and the process can be less costly.

Figure 13:
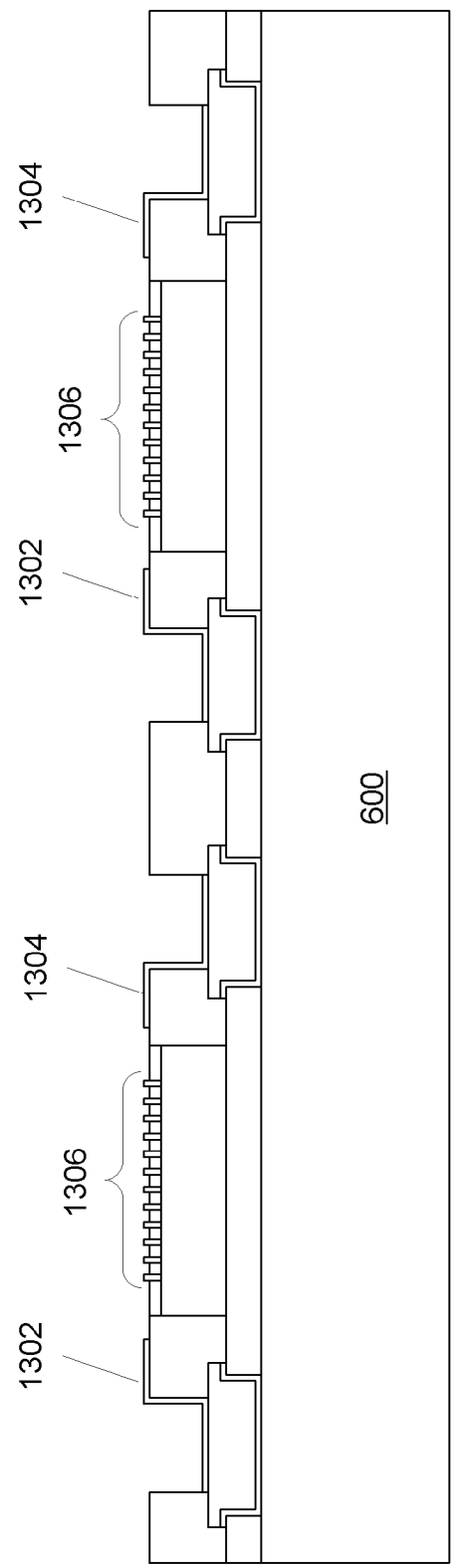
FIG. 13 illustrates, in overly simplified form, the enlarged portion of the example stable base after formation of the contacts.

FIG. 13 illustrates, in overly simplified form, the enlarged portion 800 of the example stable base 600 after formation of the contacts 1302, 1304, 1306.

At this point, a package assembly 1308 has been created that is suitable for addition of a second chip 1402 onto the first chip 1002. Thus, in the next step, the second chip 1402 is attached to the assembly 1308. Note that, because the entire process up to this point has involved a thick substrate (i.e. the stable base 600) this process is more robust than with processes where two chips are joined by hybridizing to a very thin substrate. Also note that, although the second chip 1402 can be thin at this point, all the contacts 1404 of the second chip 1402 will ideally have been put on the second chip 1402 while it is still in wafer form and thick; then the wafer containing the second chip 1402 can be thinned, diced and the second chip 1402 chip can be attached to the assembly 1308.

Advantageously, it should now be understood that, through use of a variant described herein, dual side processing and thin wafer-scale handling for processing are reduced or, ideally, eliminated.

Returning to the process, at this point the second chip 1402 is aligned with and attached to the respective connection points of the assembly 1308. Depending upon the particular implementation variant, this may involve a conventional solder attachment, a tack & fuse approach, a post and penetration connection, covalent bonding, etc.

Advantageously, where tight-pitch connections (e.g. <50 μm pitch and preferably <30 μm) are used a tack & fuse approach is desirable, although not necessary. Moreover, using low height (<25 μm high) contacts, such as can be formed using approaches from the above-incorporated patent applications, alone or in conjunction with tight pitch connections, are particularly advantageous in keeping the overall height of the final package small.

It should also now be appreciated that variants of the approaches described herein can have the advantages provided by small contact size and short connection lengths without via parasitics while also having the advantages provided by an the interposer (i.e. overcomes chip size restrictions). Moreover, these advantages can be obtained while allowing thick wafer handling and avoiding or eliminating dual-side processing.

Figure 14:
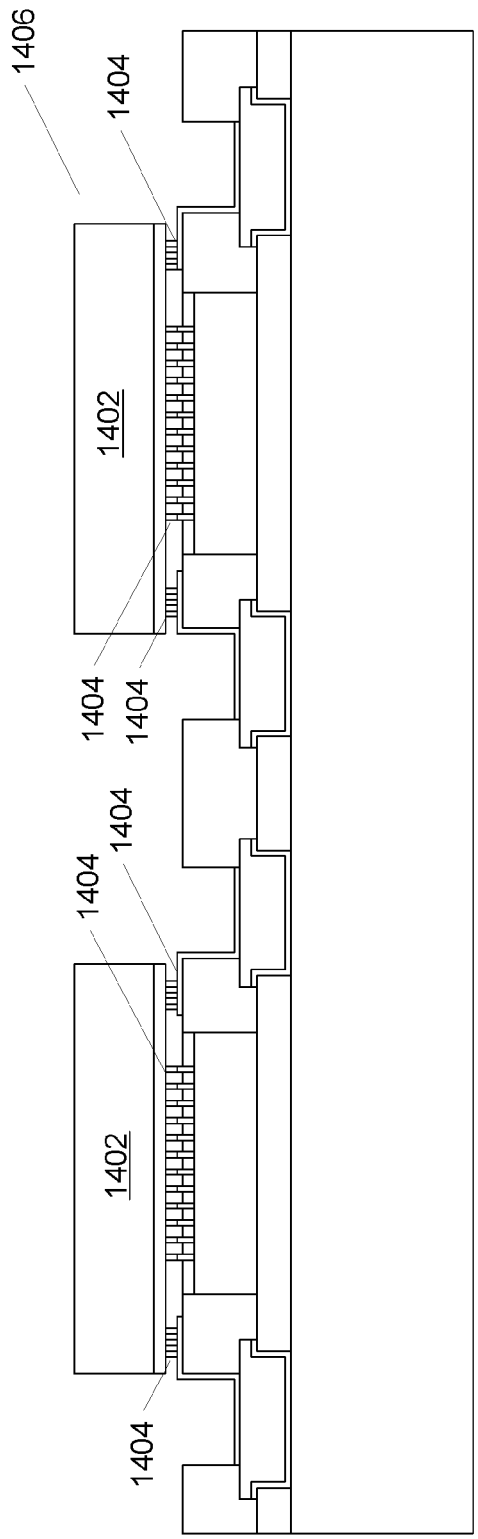
FIG. 14 illustrates, in overly simplified form, the enlarged portion of the assembly after the second chips have been attached to it.

FIG. 14 illustrates, in overly simplified form, the enlarged portion of the assembly 1308 after the second chips 1402 have been attached to it to form a more complex assembly 1406.

At this point, the main processing is complete. However, if additional chips are to be joined to the complex assembly 1406, the approach of the preceding steps can advantageously and straightforwardly be repeated as necessary.

Optionally, however, the process can be continued, for example, by adding an additional coating material 1502 to, for example, protect the chips, act as a thermal conductor, or allow the complex assembly 1406 to be planar, etc. Depending upon the particular implementation variant, the coating material 1502 can optionally be a material that is resistant to the etchants that might be used in some cases in the next step. In most implementation variants, the coating material 1502 will be a non-electrically-conductive type of material and, more particularly, one of the materials that were suitable for use as the planarizing medium 1102. Advantageously, in some cases, the coating material 1502 can also, or alternatively, provide structural support so that the wafer-like assembly created by the process described herein, can be handled in a wafer-like way after the stable base 600 has been removed.

Figure 15:
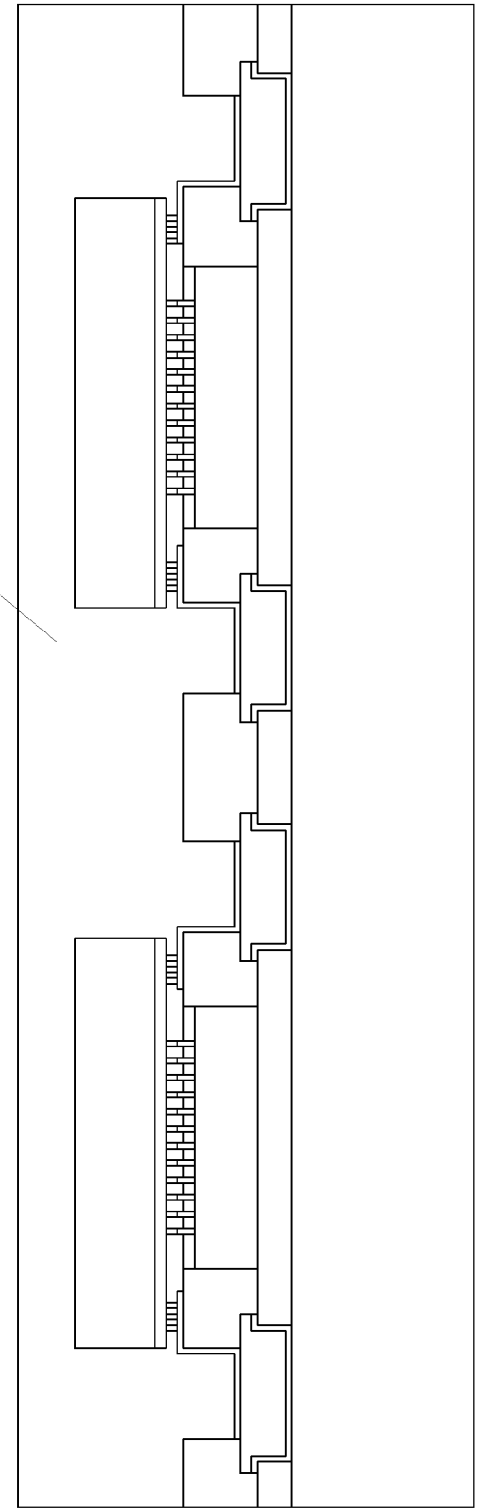
FIG. 15 illustrates, in overly simplified form, the complex assembly of FIG. 14 after addition of the coating material.

FIG. 15 illustrates, in overly simplified form, the complex assembly of FIG. 14 after addition of the coating material 1502.

Next, the stable base 600 is removed from the complex assembly 1406. Depending upon the particular material used as the stable base 600, removal can occur through any of a number of processes, the only constraint being that the process be suitable to achieve the desired removal and expose the stable base 600 side of the pads 902. Depending upon the particular implementation, the removal can be effected by grinding, lapping and/or etching down to the coating 702 if it is an etch stop layer. If the coating 702 is a sacrificial layer, that layer can be sacrificed by the appropriate process (e.g. heating, etching, chemically reacting, exposing to specific wavelength(s) of light, for example ultra-violet or infra-red, etc.) thereby allowing the complex assembly 1406 to "float away" from the stable base 600, thereby eliminating the need to remove the stable base 600 in a destructive manner. Thus, for some variants where the sacrificial layer approach is used, the stable base 600 can become reusable, further reducing costs.

Advantageously, if an etch is used and the support coating 702, planarizing medium 1102 and coating material 1502 are resistant to that etch process, then the chips in the complex assembly 1406 would be completely protected from the etch, so an aggressive process like a wet etch could be used in a batch process to remove the stable base 600 without concern.

Following removal of the stable base 600, the remaining complex assembly 1406 is, if the support coating 702, planarizing medium 1102 and coating material 1502 are polymer(s), compliant and resistant to cracking.

Figure 16:
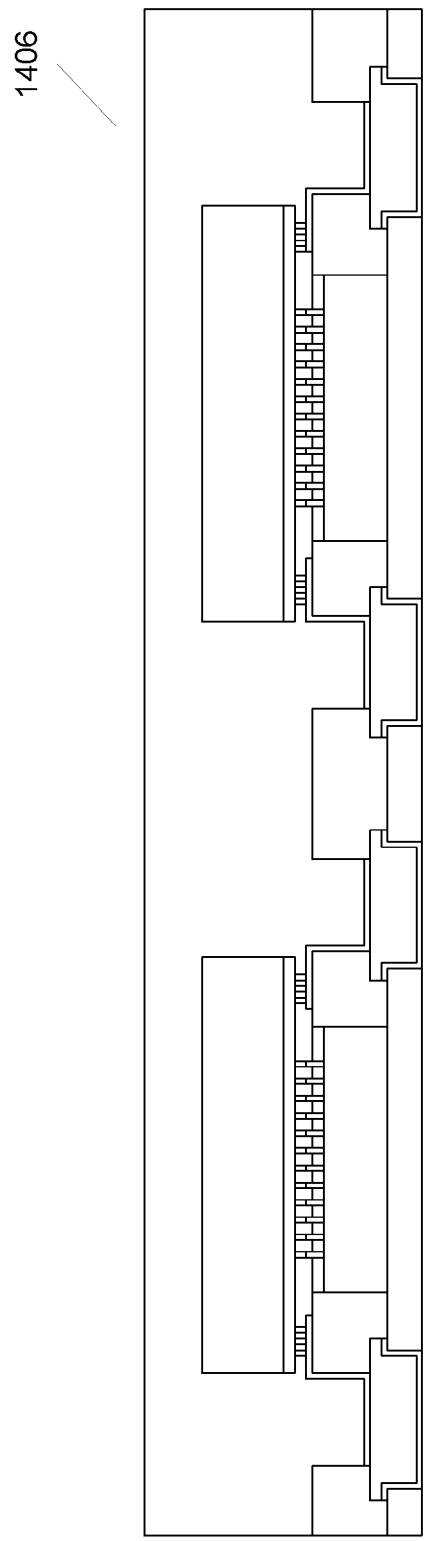
FIG. 16 illustrates, in overly simplified form, the complex assembly of FIG. 15 after removal of the stable base.

FIG. 16 illustrates, in overly simplified form, the complex assembly 1406 of FIG. 15 after removal of the stable base 600.

At this point, if, as described in conjunction with FIG. 9, the pad 902 for the contact was formed such that the bonding material, for example, gold or a solder, was added at the time of pad 902 formation, the complex assembly 1406 will be fully formed and the only thing that need be done after this point to complete the package formation process is to dice the entire wafer into individual packaged units.

Alternatively, if the now-exposed side of the pad 902 will be used with a conductive bonding material 1702, like a solder bump or gold ball, for example, the conductive bonding material 1702 can be added at this point. Advantageously, it should be noted that, because the conductive bonding material 1702 is not attached to one of the fragile pieces of silicon there is no stress created on the chips or as would be on an interposer if one were used.

Figure 17:
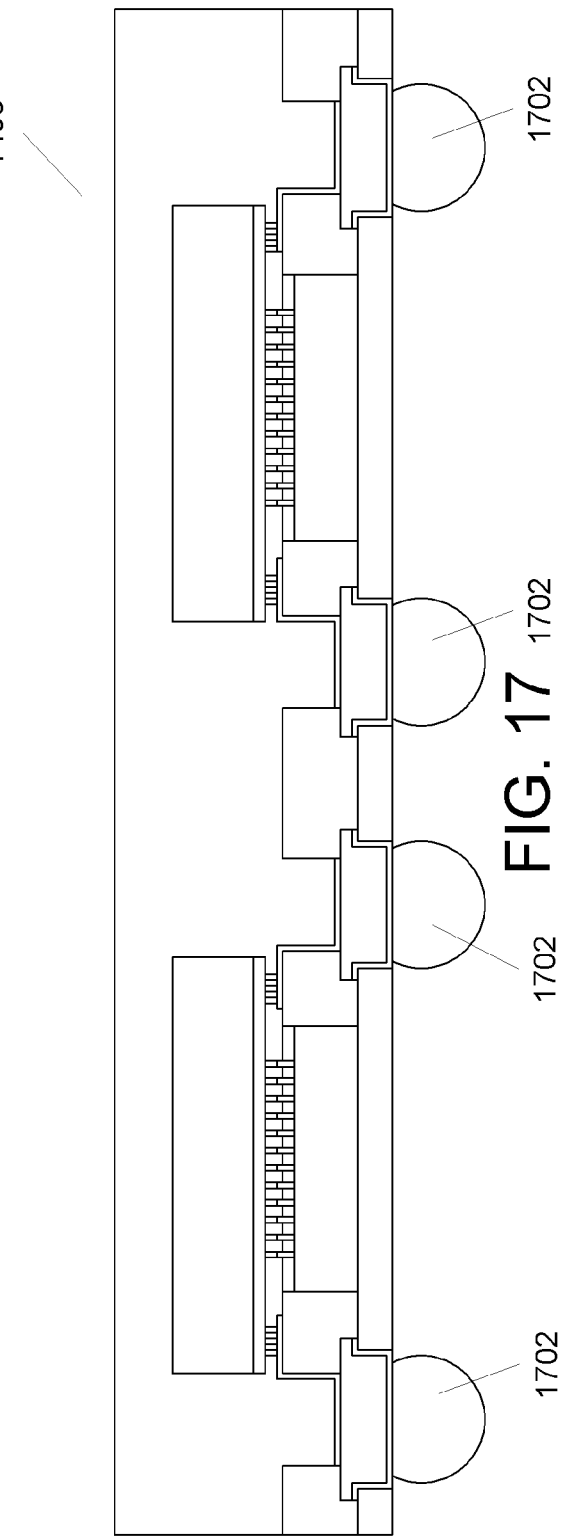
FIG. 17 illustrates, in overly simplified form, the complex assembly of FIG. 16 after addition of the conductive bonding material.

FIG. 17 illustrates, in overly simplified form, the complex assembly 1406 of FIG. 15 after addition of the conductive bonding material 1702.

Finally, the complex assembly 1406 is diced into individual packaged units 1802. Here too, it should be noted that, even if the individual chips within the complex assembly 1406 were very thin, the risk of damaging them is minimal.

FIG. 18 illustrates, in overly simplified form, two individual packaged units 1802 following dicing from the complex assembly 1406 of FIG. 15.

The second simplified example implementation family will now be described. Due to the fact that the initial steps are the same as described in connection with FIG. 6 through FIG. 12, those steps will not be reiterated here. Moreover, since this example varies from the first simplified example implementation family only with respect to the relative sizes of the chips in the stack, only those aspects particularly different for such a difference will be discussed.

Picking up following completion of the steps resulting in FIG. 12, at this point, metal connections 1902, 1904 are formed so that, for example, the pad bodies 902 are connected to the first chip 1002, the pad bodies 902, other connection points are rerouted to positions which can ultimately align with corresponding connections of another chip or some other element, or (optionally, if needed) elevated contacts 1906 are formed. Of course, as with the example of FIG. 13, in many variants, some combination of both of these will occur and, in some cases, a pad body 902, can be intentionally connected to another pad body (not shown).

Figure 19:
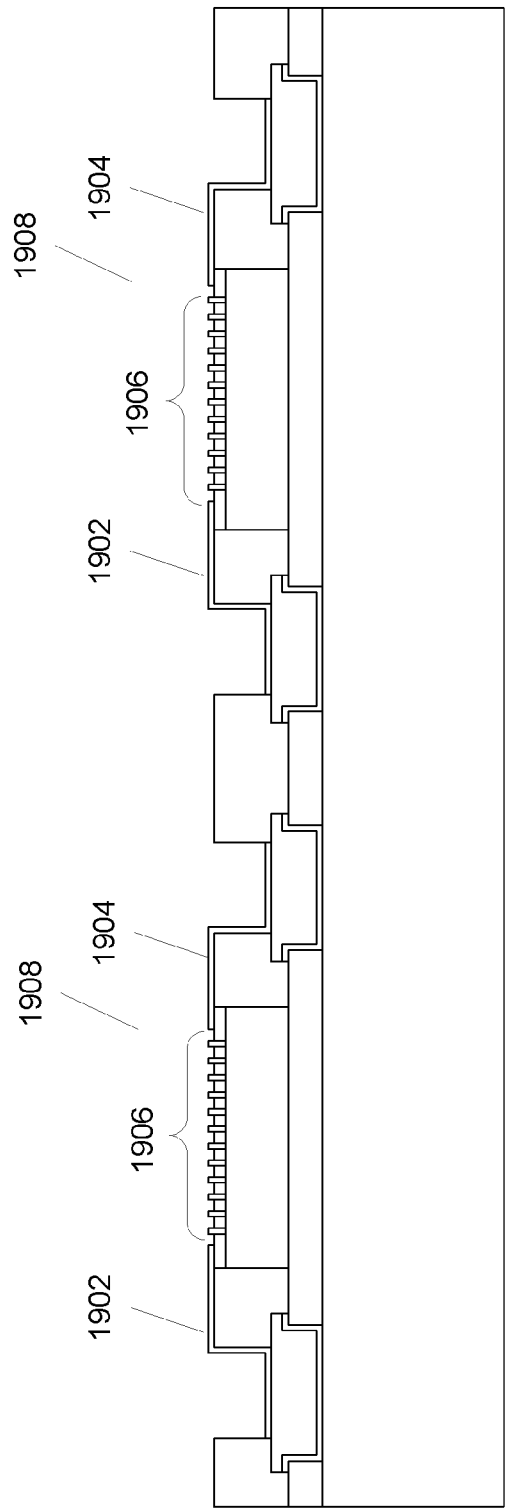
FIG. 19 illustrates, in overly simplified form, an enlarged portion of the example stable base after formation of the contacts.

FIG. 19 illustrates, in overly simplified form, an enlarged portion 1900 of the example stable base 600 after formation of the contacts 1902, 1904, 1906.

At this point, as with FIG. 13, a package assembly 1908 has been created that is suitable for addition of a second chip 2002 onto the first chip 1002. Thus, in the next step, the second chip 2002 is attached to the assembly 1908. As with the first example family, note that, although the second chip 2002 can be thin at this point, all the contacts 2004 of the second chip 2002 will ideally have been put on the second chip 2002 while it is still in wafer form and thick; then the wafer containing the second chip 2002 can be thinned, diced and the second chip 2002 chip can be attached to the assembly 1908.

At this point the second chip 2002 is aligned with and attached to the respective connection points of the assembly 1908. As noted above, depending upon the particular implementation variant, this may involve a conventional solder attachment, a tack & fuse approach, a post and penetration connection, covalent bonding, etc.

Figure 20:
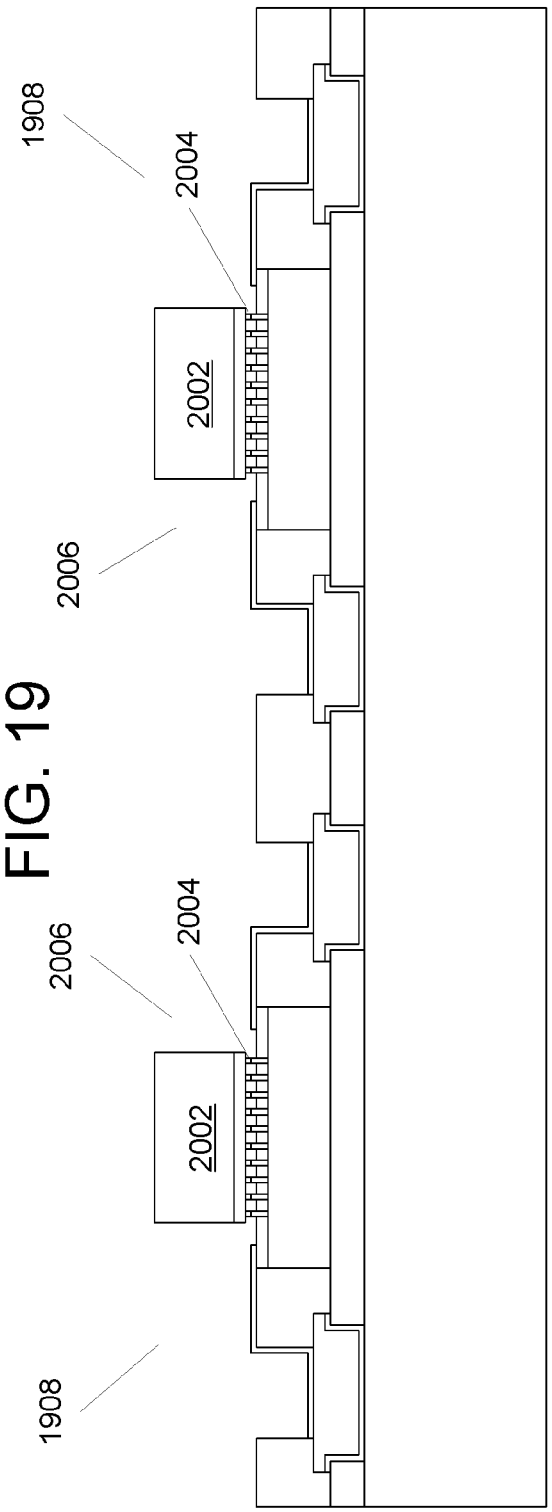
FIG. 20 illustrates, in overly simplified form, the enlarged portion of the assembly after the second chips have been attached to it to form a more complex assembly.

FIG. 20 illustrates, in overly simplified form, the enlarged portion of the assembly 1908 after the second chips 2002 have been attached to it to form a more complex assembly 2006.

Note that, because the second chip 2002 is smaller in extent than the second chip 1402, the second chip 2002 does not connect to the peripheral contacts 1902, 1904, but rather only connects to the contacts 1906 within the extent of the second chip 2002. However, through use of routing layers, contacts at the periphery can be routed to be within the extent of the second chip 2002 so that, in effect, the routing can move a contact at the periphery to a different and more centralized location.

Thereafter the processing proceeds as described in connection with FIG. 15 through FIG. 18. Thus, FIG. 21 illustrates, in overly simplified form, the complex assembly 2006 of FIG. 20 after addition of the coating material 1502 as described above.

Figure 21:
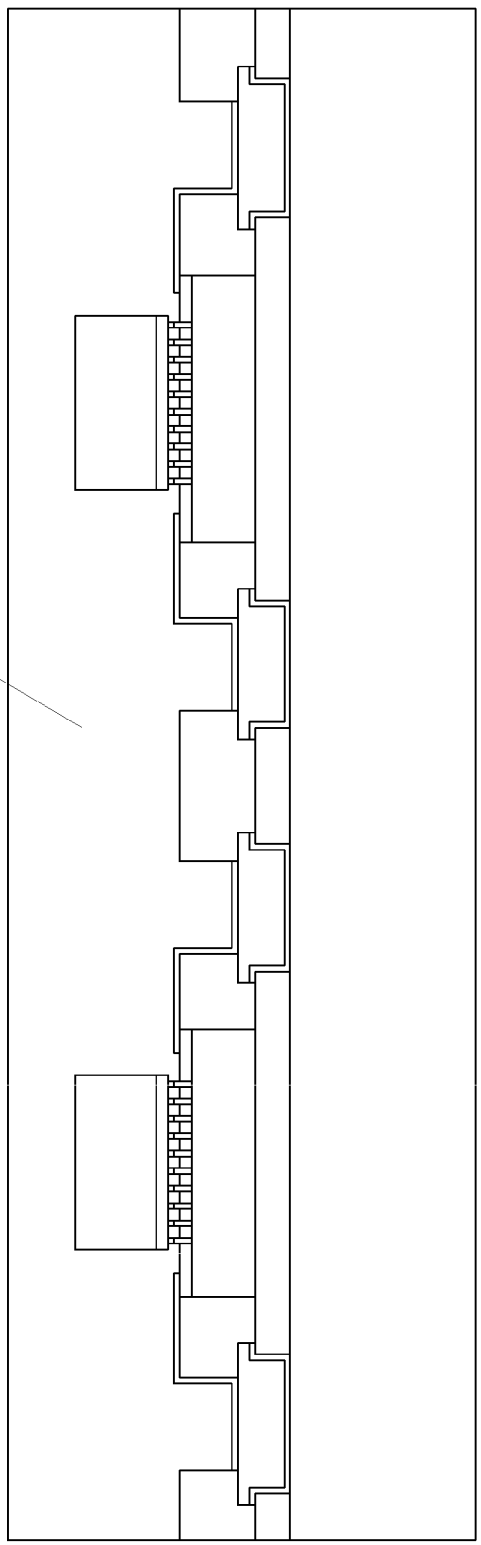
FIG. 21 illustrates, in overly simplified form, the complex assembly of FIG. 20 after addition of the coating material as described above.
Figure 22:
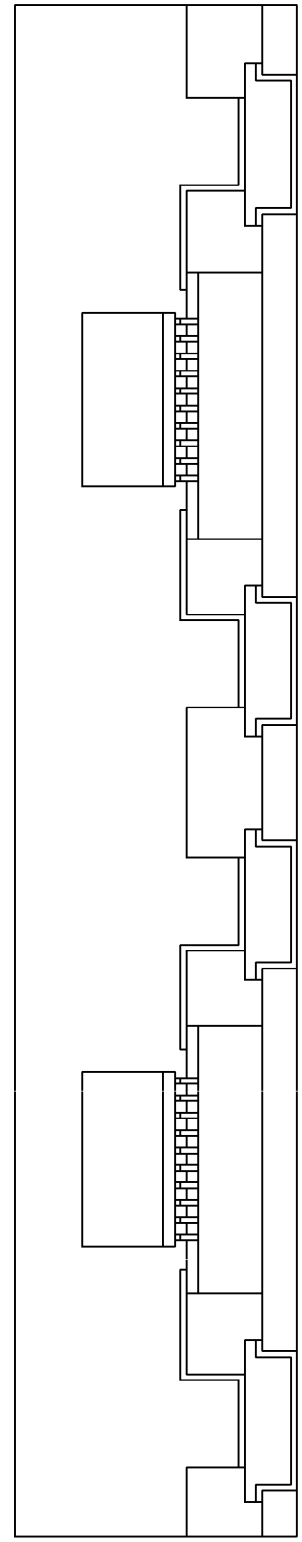
FIG. 22 illustrates, in overly simplified form, the complex assembly of FIG. 21 after removal of the stable base as described above.

FIG. 22 illustrates, in overly simplified form, the complex assembly 2006 of FIG. 21 after removal of the stable base 600 as described above.

Figure 23:
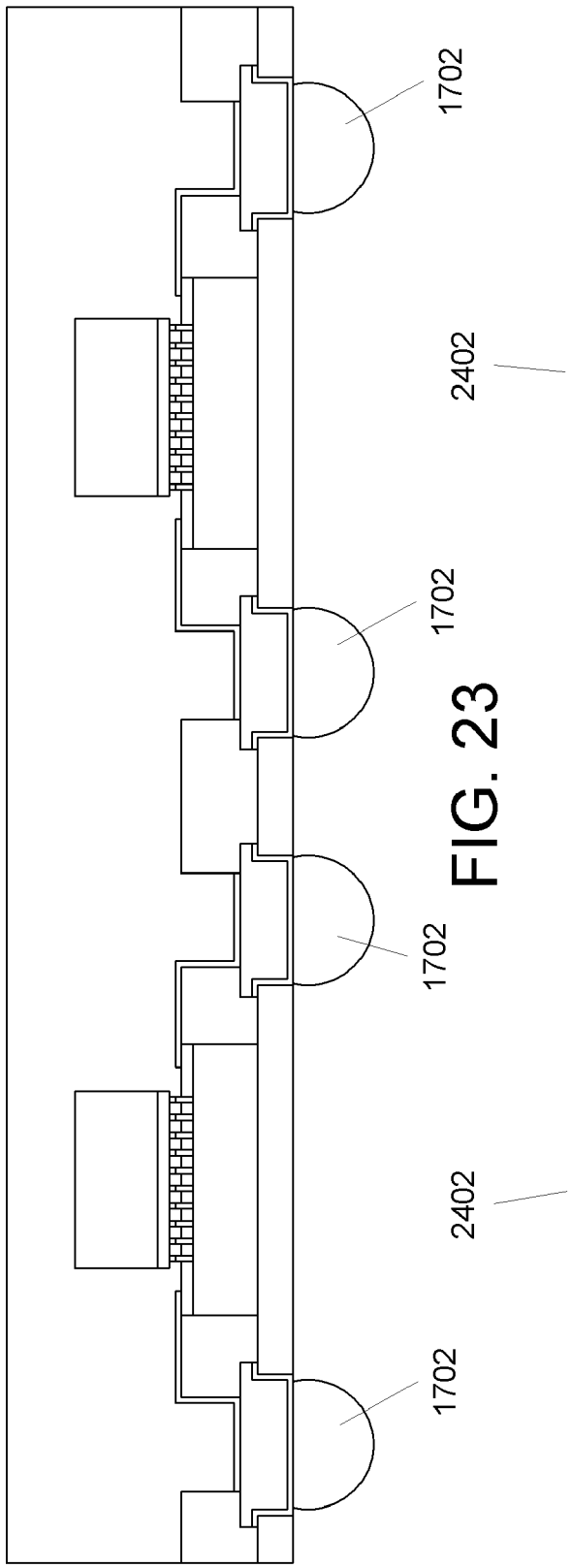
FIG. 23 illustrates, in overly simplified form, the complex assembly of FIG. 22 after addition of the conductive bonding material as described above.

FIG. 23 illustrates, in overly simplified form, the complex assembly 2006 of FIG. 22 after addition of the conductive bonding material 1702 as described above.

Figure 24:
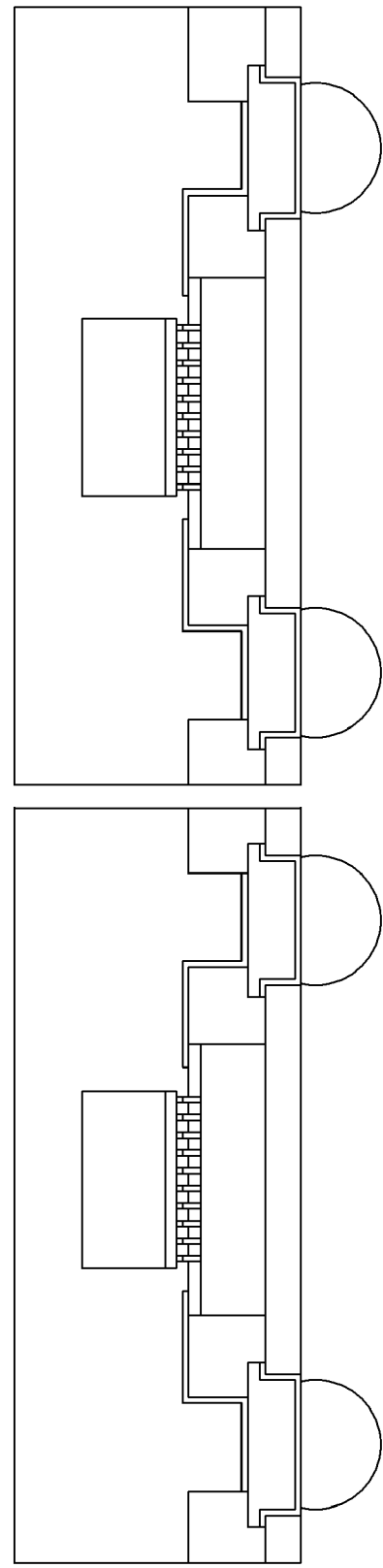
FIG. 24 illustrates, in overly simplified form, two individual packaged units following dicing from the complex assembly of FIG. 22 as described above.

FIG. 24 illustrates, in overly simplified form, two individual packaged units 2402 following dicing from the complex assembly 2006 of FIG. 22 as described above.

From the above it should now be apparent that some of the above steps can be iteratively employed in the same approach to add a third or additional chips.

Finally for these two families, it should be evident that variants involving two chips of the same size can be processed in the same manner as described above in connection with either the first or second family of implementations.

Based upon the above, it should advantageously further be appreciated that the above approach is not incompatible with aspects of the wirebond or interposer approaches, should there be a need or desire to employ those as well.

Figure 25:
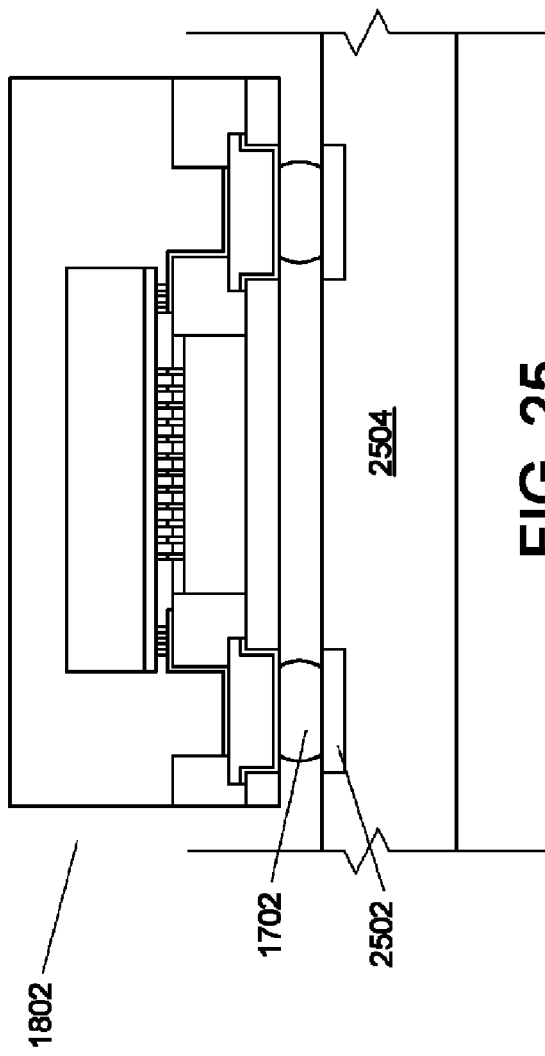
FIG. 25 illustrates, in overly simplified form, a variant in which an individual packaged unit from the first family approach is externally connected to a pad of an interposer via a solder ball bump.

FIG. 25 illustrates, in overly simplified form, a variant in which an individual packaged unit 1802 from the first family approach is externally connected to a pad 2502 of an interposer 2504 via a solder ball bump 1702.

Figure 26:
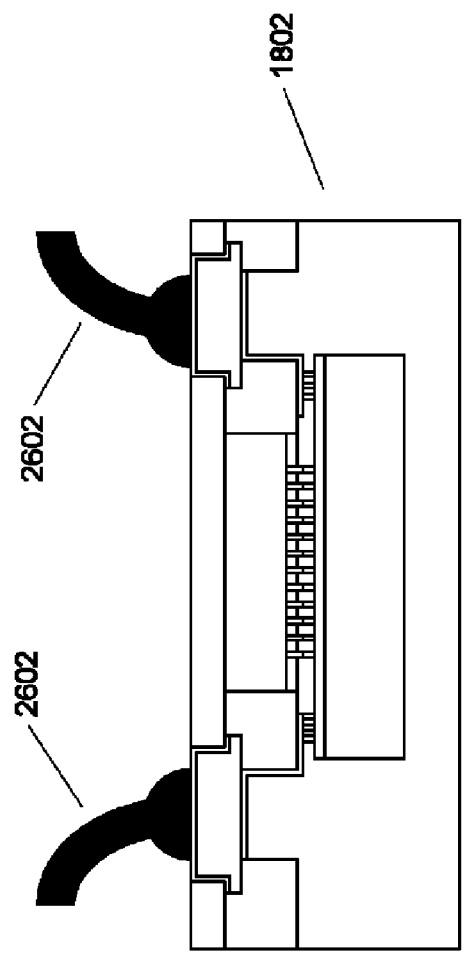
FIG. 26 illustrates, in overly simplified form, a variant in which an individual packaged unit from the first family approach is externally connected to some other element by wirebond connections.

FIG. 26 illustrates, in overly simplified form, a variant in which an individual packaged unit 1802 from the first family approach is externally connected to some other element (not shown) by wirebond connections 2602.

Figure 27:
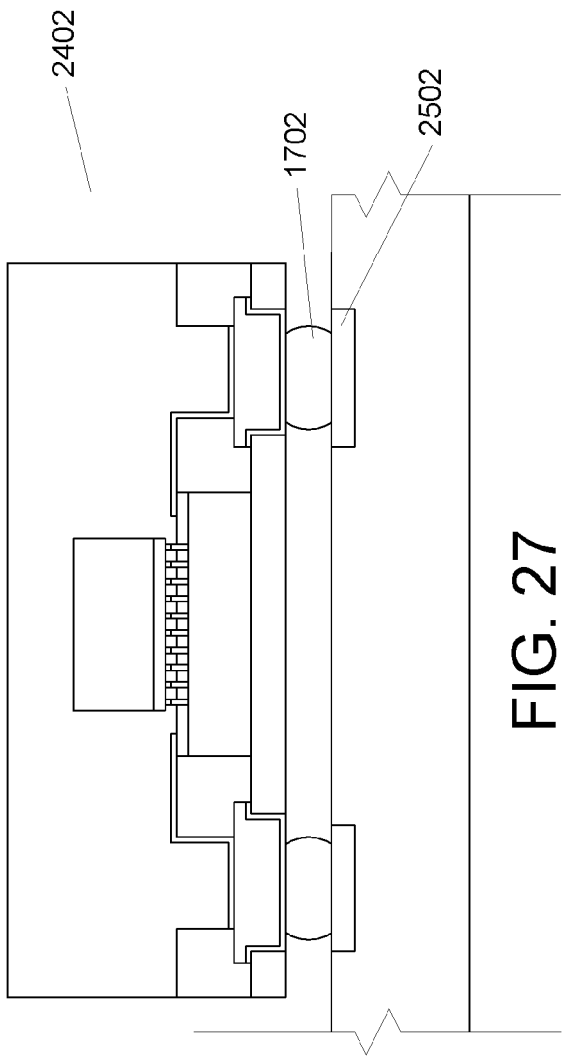
FIG. 27 illustrates, in overly simplified form, a variant in which an individual packaged unit from the second family approach is externally connected to a pad of an interposer via a solder ball bump.

FIG. 27 illustrates, in overly simplified form, a variant in which an individual packaged unit 2402 from the second family approach is externally connected to a pad 2502 of an interposer 2504 via a solder ball bump 1702.

Figure 28:
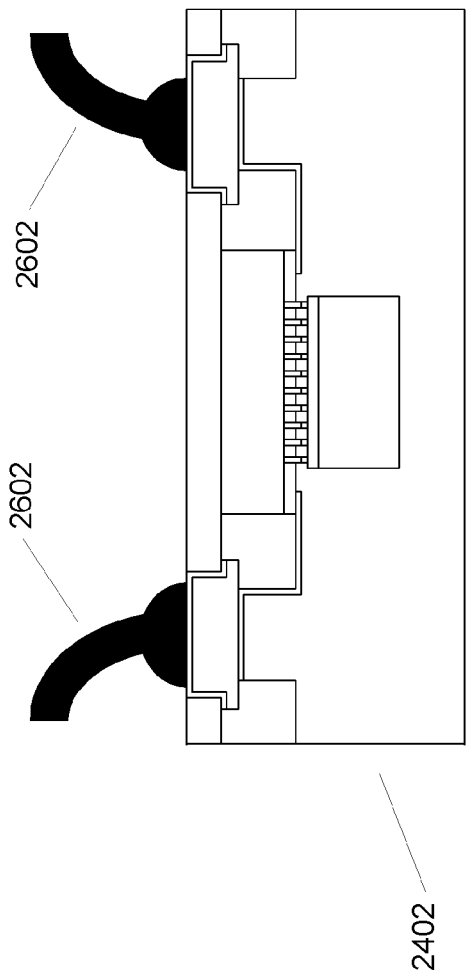
FIG. 28 illustrates, in overly simplified form, a variant in which an individual packaged unit from the second family approach is externally connected to some other element by wirebond connections.

FIG. 28 illustrates, in overly simplified form, a variant in which an individual packaged unit 2402 from the second family approach is externally connected to some other element (not shown) by wirebond connections 2602.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A packaging method, comprising:
   forming a contact pad on a base;
   attaching a first chip to the base;
   disposing a planarizing medium over the base such that a surface of the planarizing medium is substantially coincident with a surface of the first chip;
   forming an electrical path directly on the planarizing medium to create an electrical connection between the first chip and the contact pad after said disposing;
   coupling a second chip to the first chip; and
   removing the base.

2. The packaging method of claim 1, further comprising providing a support coating on the base before said forming a contact pad, wherein the contact pad is then formed in the support coating.

3. The packaging method of claim 2, wherein the support coating comprises a release layer.

4. The packaging method of claim 3, wherein the support coating further comprises an etch stop layer.

5. The packaging method of claim 1, wherein the second chip is electrically connected to the electrical path.

6. The packaging method of claim 1, further comprising providing a coating material over at least a portion of the second chip, at least a portion of the planarizing medium, and at least a portion of the electrical path.

7. A packaging method, comprising:
   forming a contact pad on a base;
   attaching a first chip to the base;
   disposing a planarizing medium over the base and over at least a portion of the first chip;
   removing at least a portion of the planarizing medium that is disposed over the first chip;
   forming an electrical path between the first chip and the contact pad on the planarizing medium after said disposing, wherein the electrical path electrically connects the first chip to the contact pad;
   coupling a second chip to the first chip such that no portion of the planarizing medium is disposed between the first and second chips; and
   removing the base.

8. The packaging method of claim 7, wherein said forming a contact pad further comprises forming the contact pad into the base.

9. The packaging method of claim 7, further comprising providing a support coating on the base before said forming a contact pad, wherein the contact pad is then formed in the support coating.

10. The packaging method of claim 9, wherein the support coating comprises a release layer, and wherein said removing the base comprises at least one of etching the release layer or applying heat to the release layer.

11. The packaging method of claim 7, wherein said removing the base comprises at least one of etching the base, grinding the base, or lapping the base.

12. The packaging method of claim 7, wherein the planarizing medium electrically insulates sides of the first chip.

13. The packaging method of claim 7, wherein said providing a planarizing medium comprises applying the planarizing medium up to an elevation above the base, and wherein the elevation is substantially coincident with a surface of the first chip that is opposite the base.

14. A packaging method, comprising:
   forming a contact pad on a base;
   coupling a first chip to the base;
   applying a planarizing medium over at least a portion of the base and over at least a portion of the first chip;
   removing portions of the planarizing medium to expose the contact pad, to expose the first chip, and to create a planar surface across at least a portion of the planarizing medium;
   forming an electrical path between the first chip and the contact pad on the planarizing medium after said applying to electrically connect the first chip to the contact pad;
   bringing an electrical connection point of a second chip into physical contact with at least one electrical connection point of the first chip such that no portion of the planarizing medium is disposed between the first and second chips; and
   removing the base.

15. The packaging method of claim 14, wherein said removing a first portion of the planarizing medium comprises removing the planarizing medium to expose a side, opposite the base, of the contact pad.

16. The packaging method of claim 14, wherein said coupling a first chip to the base comprises attaching the first chip to the base with an adhesive.

17. The packaging method of claim 14, further comprising providing a support coating on the base before said forming a contact pad, wherein the contact pad is then formed in the support coating.

18. The packaging method of claim 17, wherein said providing a support coating comprises applying a layer of sacrificial material or a dielectric.

19. The packaging method of claim 18, wherein said providing a support coating comprises applying a layer of sacrificial material, and wherein said removing the base comprises removing the layer of sacrificial material.

20. The packaging method of claim 19, wherein said removing the layer of sacrificial material comprises one or more of heating the layer of sacrificial material, etching the layer of sacrificial material, or causing the layer of sacrificial material to undergo a destructive chemical reaction.

21. The packaging method of claim 14, wherein said forming an electrical path comprises electroplating or electrolessly plating a metal.

22. The packaging method of claim 14, further comprising, between said bringing and said removing, adding a coating material onto a side of the second chip.

23. The packaging method of claim 22, wherein said adding a coating material comprises disposing a coating material around at least three sides of the second chip and around at least three sides of the first chip.

24. The packaging method of claim 22, wherein the coating material is in physical contact with the second chip.

25. The packaging method of claim 1, wherein the first chip is attached to the base in a face-up configuration and the second chip is coupled to the first chip in a face-down configuration.

26. The packaging method of claim 1, wherein the second chip is wider than the first chip.

* * * * *